United States Patent [19]

Senes

[11] Patent Number: 5,245,499
[45] Date of Patent: Sep. 14, 1993

[54] MONOLITHIC OVERVOLTAGE PROTECTION DEVICE

[75] Inventor: Albert Senes, Saint Cyr Sur Loire, France

[73] Assignee: SGS-Thomson Microelectronics S.A., Gentilly, France

[21] Appl. No.: 728,226

[22] Filed: Jul. 12, 1991

[30] Foreign Application Priority Data

Jul. 13, 1990 [FR] France .................. 90 09265

[51] Int. Cl.$^5$ .......................... H02H 9/04
[52] U.S. Cl. .................. 361/56; 361/91; 361/111
[58] Field of Search ........... 361/56, 58, 91, 111; 357/23.13, 13, 38, 39, 53

[56] References Cited

U.S. PATENT DOCUMENTS

| | | | |
|---|---|---|---|
| 4,282,555 | 8/1981 | Svedberg | 361/56 |
| 4,322,767 | 3/1982 | El Hamamsy et al. | 361/56 |
| 4,748,533 | 5/1988 | Hertrich et al. | 361/56 |

FOREIGN PATENT DOCUMENTS

| | | |
|---|---|---|
| WO90/03681 | 4/1990 | European Pat. Off. . |
| 2382789 | 3/1978 | France . |
| 2598043 | 5/1986 | France . |
| 2208257 | 3/1989 | United Kingdom . |

Primary Examiner—Todd E. DeBoer
Attorney, Agent, or Firm—Lowe, Price, LeBlanc & Becker

[57] ABSTRACT

A protection device against overvoltages liable to occur between two supply terminals (A, B) comprises between the supply terminals, an avalanche triggered thyristor (6) having a determined break-over voltage ($V_{BO}$) This system further comprises a zener diode (4) in parallel and reversely connected with the thyristor; the diode is selected so that its avalanche voltage ($V_{BR}$) is lower than the break-over voltage of the thyristor and gets higher only for overvoltages having a higher duration or amplitude than a predetermined threshold.

15 Claims, 4 Drawing Sheets

MONOLITHIC OVERVOLTAGE PROTECTION DEVICE

BACKGROUND OF THE INVENTION

The present invention relates to an overvoltage protection device and its implementation as a monolithic semiconductor component.

FIG. 1 shows the conventional arrangement of a protection device 1. Given a power supply voltage available between the input terminals A and B, and an electronic circuit 2 to be protected, the protection device is positioned between the input terminals A and B.

Two main types of protection devices are commonly used.

A first type of protection device, for example a zener diode, is designed to clip the overvoltage pulses occurring between terminals A and B. The current/voltage characteristic of this component is of the type illustrated in FIG. 2A, namely, as soon as the voltage across the zener diode terminals exceeds a determined value, called breakdown voltage or avalanche voltage $V_{BR}$ of the diode, the current increases up to a substantially constant voltage. Thus, as shown in FIG. 2B, pulses P1 and P2 that are added to a supply voltage such as a full-wave rectified voltage are clipped and, upon the end of the pulse, the normal supply is again present across the terminals of the device 2 to be protected.

A second type of protection device, such as an avalanche triggered thyristor exhibits the current/voltage characteristic shown in FIG. 3A. As soon as the voltage applied to this device exceeds a value $V_{BO}$, or break over value, the device becomes conductive and the voltage across its terminals drops to a very low value. The system then remains at the conductive state as long as the supply current is not decreased to a value lower than a hold current $I_H$. BY way of example, voltage $V_{BO}$ can be about a few hundreds volts and the voltage $V_H$ about ten volts. The effect of such a protection system on a full-wave rectified voltage is illustrated in FIG. 3B. It can be noted that, from pulse P1, the device 2 is no longer supplied until the following half-period.

Each of the protection devices above described exhibits advantages and drawbacks.

A major drawback of zener diode systems is that, when pulses have a long duration time, a substantially high current flows during the pulse duration through the diode which has a high voltage across its terminals (about 400 volts, for example, for a mains protection device) which causes an increase of the diode temperature. It is then necessary to provide large-size and costly diodes.

A major drawback of devices of the avalanche thyristor type is that, after each overvoltage, supply is interrupted until resetting of the supply voltage. Thereby, malfunctions occur in the device to be protected that is no longer energized or that has to include a high input tank capacitor to palliate these voltage drops. Despite this drawback, one is induced to use protection devices of this type when overvoltages are liable to be of high energy (large amplitude or duration).

However, in practice, the problem encountered is somewhat different. Indeed, FIG. 4 shows the results of a statistic survey achieved on subscribers' lines in Europe. This survey corresponds to an observation for 112 days of a subscriber's line and shows the occurrence of 1009 overvoltages. More particularly, FIG. 4 is a table showing the probability of occurrence of overvoltages of determined amplitude and duration. The table of FIG. 4 shows that 29.44% of the observed overvoltages have a value ranging from 200 to 300 volts above the normal mains voltage and a duration ranging from 1 to 3 microseconds whereas 0.42% only of the observed overvoltages have a value ranging from 600 to 700 volts and a duration ranging from 3 to 10 microseconds.

The observed overvoltages can be classified into two groups: high energy and low energy overvoltages. High energy overvoltages are characterized either by a long time duration (for example over 10 microseconds) even if their amplitude is relatively low (for example lower than 300 volts), or by a high amplitude (for example over 600 volts) even if their duration is relatively short (for example smaller than one microsecond). Low energy overvoltages exhibit complementary characteristics. In the above example, they have an amplitude lower than 600 volts and a time duration smaller than 10 microseconds.

Referring to the table of FIG. 4, it can be noted that low energy pulses occur in 96.38% of the observed cases, whereas high current overvoltages represent only 3.62% of the cases. However, conventionally, and to take into account high energy overvoltages, a clipping-type protection device such as a zener diode is not sufficient and it is necessary to resort to a shorting-type device such as avalanche thyristor.

SUMMARY OF THE INVENTION

An object of the invention is to provide a protection device operating in a clipping mode for low energy overvoltage pulses and in a shorting mode only for high energy pulses.

A further object of the invention is to provide the implementation as a semiconductor monolithic component of such a device allowing a determined adjustment of the relative characteristics of the various components of the protection device.

To attain these objects and others, the invention provides a protection device against overvoltages liable to occur between two terminals A and B, comprising, between these terminals, an avalanche triggered thyristor having a determined break over voltage. This circuit further comprises a parallel zener diode, reversely connected with the thyristor, this diode being selected so that its avalanche voltage is lower than the break over voltage and gets higher only for overvoltages having a time duration or an amplitude higher than a predetermined threshold.

The device according to the invention can be implemented as a monolithic semiconductor component comprising an N-type semiconductor substrate and including in a first vertical portion layers adapted to form an avalanche triggered thyristor and in a second vertical portion layers adapted to form a zener diode, the upper surface being metallized and shorting the anode of the zener diode and the cathode of the thyristor, and the lower surface being metallized and shorting the cathode of the zener diode and the anode of the thyristor, wherein the NP junction between the substrate and the upper P layer in which is triggered the avalanche mode has a higher concentration gradient in the portion corresponding to the zener diode than in the portion corresponding to the thyristor.

BRIEF DESCRIPTION OF THE DRAWINGS

The foregoing and other objects, features and advantages of the invention will be apparent from the following detailed description of preferred embodiments as illustrated in the accompanying figures wherein:

In FIGS. 7 and 8, it will be noted that, as conventional in integrated circuit representation, the thicknesses and lateral dimensions of the various regions and layers are not drawn to scale but are arbitrarily enlarged in order to facilitate the legibility and the drawing of the figures.

DETAILED DESCRIPTION OF THE INVENTION

Figure 1:
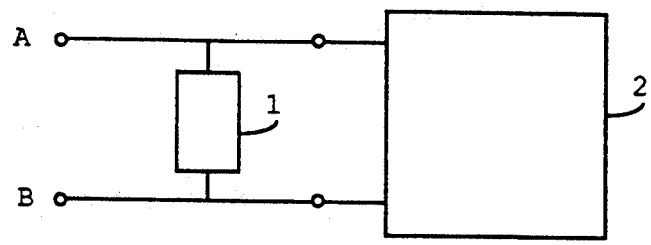
FIGS. 1, 2A, 2B, 3A, 3B and 4 are designed to illustrate the state of the art and the problem that the invention aims at solving, are above described.
Figure 2A:
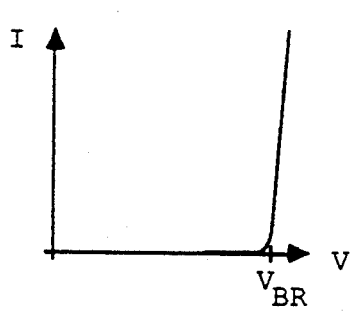
Figure 2B:
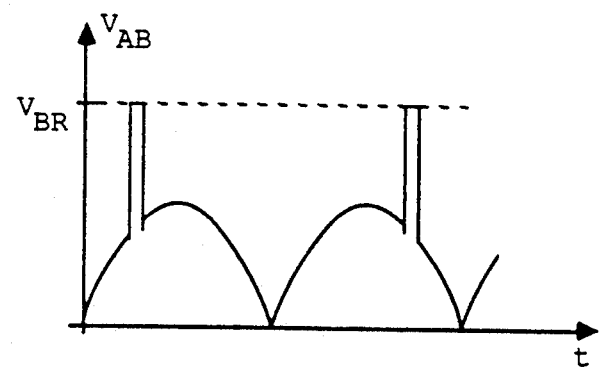
Figure 3A:
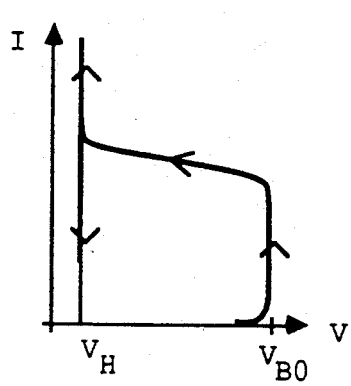
Figure 3B:
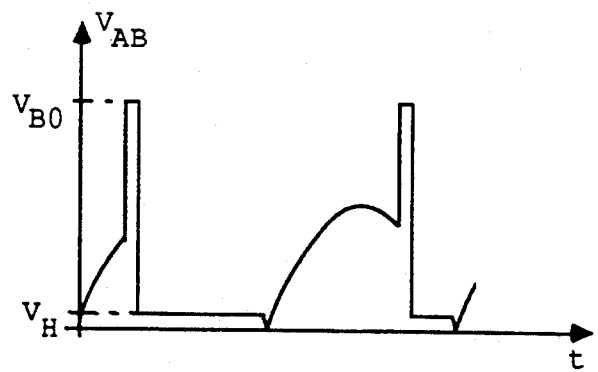
Figure 4:
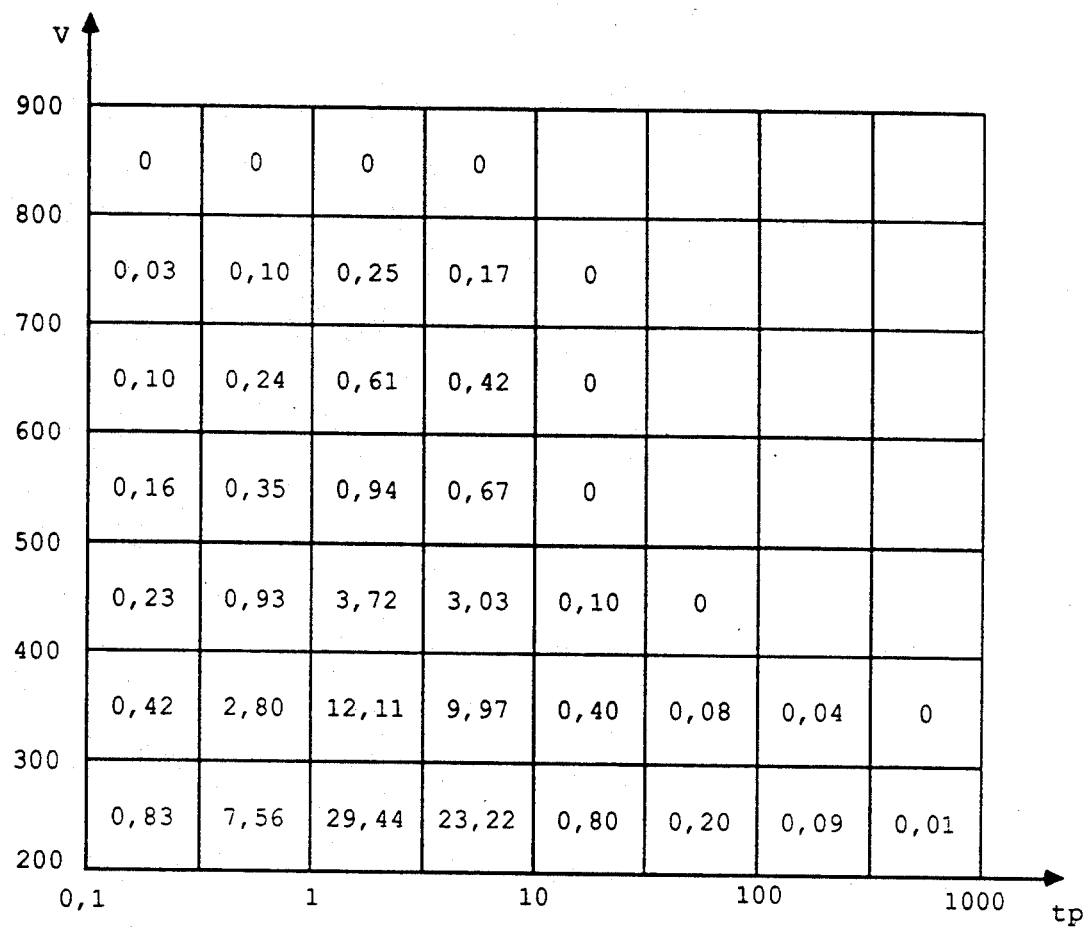
Figure 5:
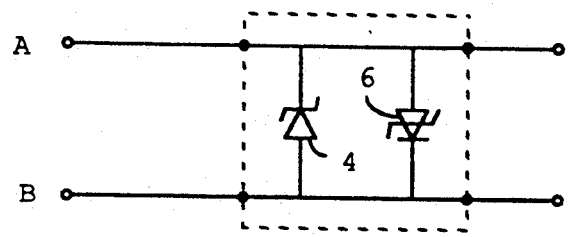
FIG. 5 is a circuit diagram of a protection device according to the invention.

FIG. 5 shows a protection device according to the invention. The protection device comprises, between supply terminals A and B, a zener diode 4 in anti parallel with an avalanche triggered thyristor 6, that is, a gateless thyristor which is switched ON when the voltage across its terminals becomes higher than a determined value.

Figure 6:
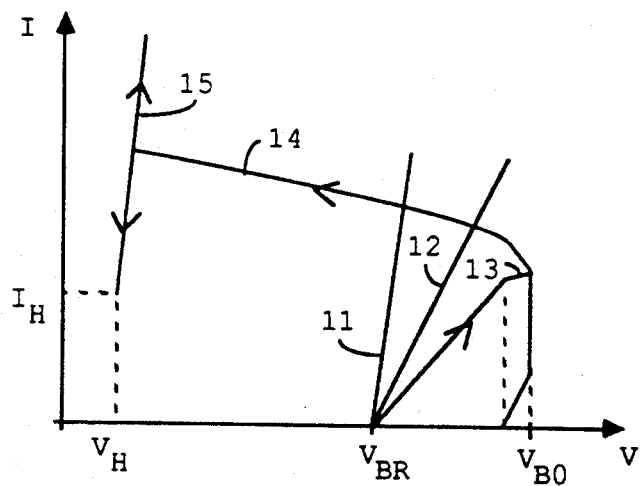
FIG. 6 shows current/voltage curves designed to illustrate the operation of the device according to the invention.

FIG. 6 shows the operation of a device according to the invention. The zener diode has an avalanche voltage $V_{BR}$ and, as soon as the voltage across its terminals exceeds this value $V_{BR}$, the current rapidly increases while the voltage remains substantially constant. However, the zener diode has a determined dynamic resistance.

The invention takes advantage of the fact that this dynamic resistance is variable and especially depends upon the temperature of the zener junction. In the presence of a long pulse, the diode temperature rises and its dynamic resistance increases. In FIG. 6, curve 11 corresponds to the case of a short pulse, curve 12 to a medium pulse and curve 13 to a long pulse.

Thyristor 6 is selected so that its break over voltage $V_{BO}$ is higher than the voltage $V_{BR}$ of the zener diode. The difference between values $V_{BO}$ and $V_{BR}$ is such that voltage $V_{BO}$ is reached only for relatively long pulses (curve 13) or for short but high pulses (not shown extension of curve 12). When voltage $V_{BO}$ is reached, an avalanche effect occurs in the thyristor and the break over phenomenon appears, that is, the voltage across the terminals abruptly decreases, as indicated by curve 14, to reach a low voltage substantially equal to a value $V_H$ as indicated by curve 15. Then, it is only when the supply voltage decreases and the current becomes lower than $I_H$ that thyristor 6 is blocked again.

Then, a device operating as a clipping circuit for low current pulses and as a shorting circuit for high current pulses is obtained.

Those skilled in the art will select the difference between values $V_{BO}$ and $V_{BR}$ as a function of the time duration and/or limit amplitude of the pulses against which it is desired to protect the circuit. For example, they will select values of 450 and 400 volts or 500 and 450 volts, respectively.

A method for accurately setting the difference between voltages $V_{BR}$ and $V_{BO}$ consists in implementing as a monolithic component, the zener diode 4 and the avalanche triggered thyristor 6.

Figure 7:
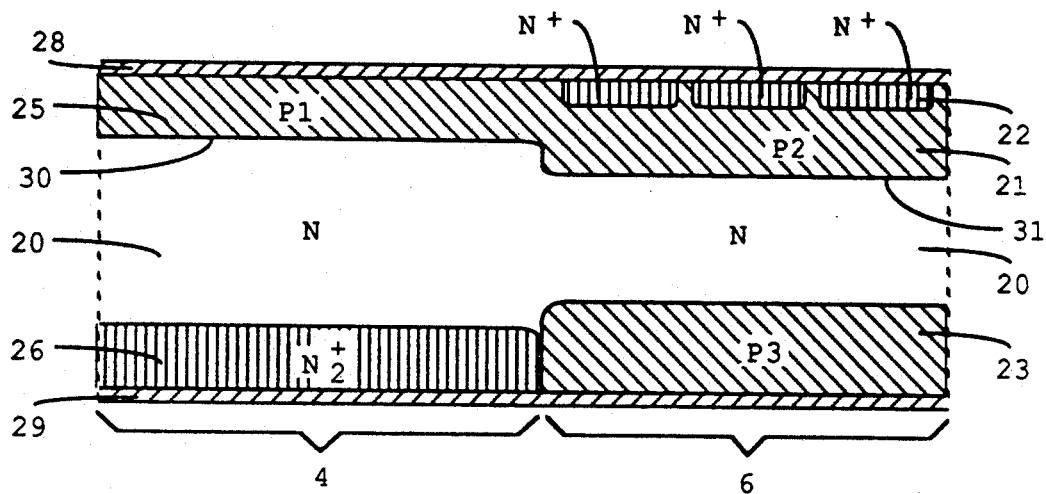
FIG. 7 shows an embodiment as a monolithic semiconductor circuit of a component according to the invention.

A first embodiment of such a monolithic component is shown in FIG. 7.

The right portion of FIG. 7 corresponds to thyristor 6 and the left portion to zener diode 4. This component is manufactured from an N-type semiconductor substrate 20.

On the side of the thyristor, a P-type layer 21 and an N-type cathode or emitter layer 22, conventionally provided with emitter shortings, are formed above the substrate. On the other side of substrate 20, on the lower surface, is formed a P-type anode layer 23.

On the side of the diode, a P-type anode layer 25 is formed on the upper surface of substrate 20 and an $N^+$-type cathode layer 26 is formed on the lower surface.

A metallization 28 covers the upper surface of the component and forms the anode of the diode and the cathode of the thyristor. A metallization 29 covers the lower surface of the component and forms the cathode of the diode and the anode of the thyristor. The junction which determines the avalanching of diode 4 is junction 30 between the N-type substrate 20 and the P-type layer 25. The junction which determines the avalanching of thyristor 6 is junction 31 between the substrate 20 and the P type layer 21. In order for diode 30 to be set in avalanche mode before the thyristor, it is necessary that the concentration gradient of the doping impurities is higher at junction 30 than at junction 31.

Those skilled in the art know various means for obtaining such a difference in concentration gradients. One of the means that can be used consists in implanting a dopant in region 21 and to carry out a first annealing then implanting a dopant in region 25 and to carry out a second annealing during which the doping atoms in region 21 will continue to diffuse.

The structure shown in FIG. 7 is particularly simple to achieve. However, it is known that the value of the avalanche voltages will highly depend upon the concentration of substrate 20. But, this concentration is relatively variable from one wafer to another and even within distinct regions of a same wafer. A determined difference will effectively be obtained between the avalanche levels of the two components but the absolute value of the avalanche voltage of each of these components will be relatively variable.

Figure 8:
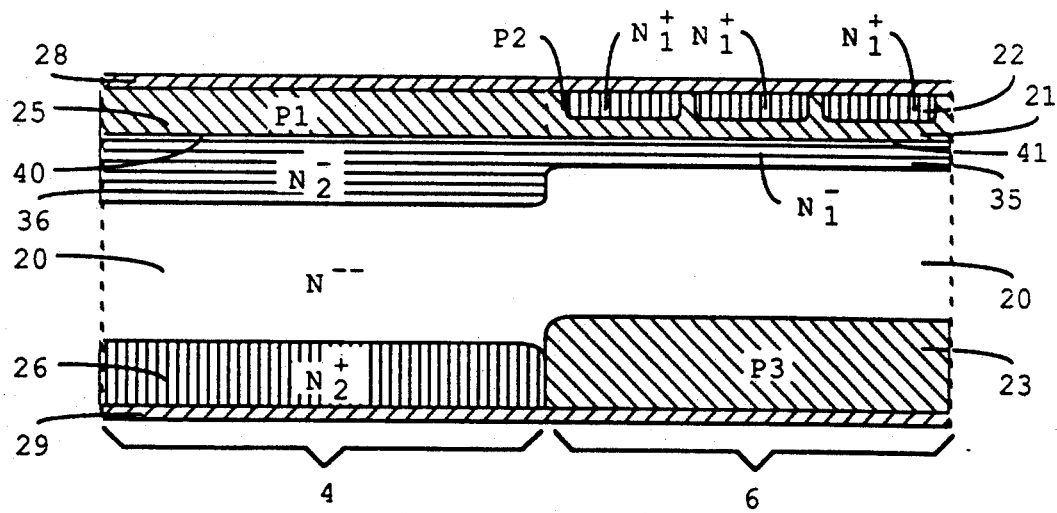
FIG. 8 shows a variant of a monolithic protection device according to the invention.

In order to avoid this drawback, it is possible to use the embodiment shown in FIG. 8 wherein the same layers and layer portions as in FIG. 7 are designated by the same references. In this embodiment, layers 21 and 25 are formed during a single step. The concentration gradient at the junctions is achieved by varying the concentration on the N side of each of the junctions that is desired to set to avalanche mode. For this purpose, before forming layer 21–25, more highly doped regions N-type 35 and 36 are formed at the surface of the substrate, on the side of the thyristor and on the side of the diode, respectively, and the junctions of interest are junction 41 between layers 21 and 35 and junction 40 between layers 36 and 25. Regions 35 and 36 can be formed either by implanting different dopant doses N on the side of the diode and on the side of the thyristor and by carrying out an annealing process or, as above indicated, by proceeding in two steps, that is, by implanting a first dopant followed by annealing, then by implanting a second dopant followed by a second annealing. With this method, it is possible to accurately adjust concentrations and concentration gradients at the junctions for layers 35 and 36 and to obtain components having more accurate avalanche voltage values than in the case of the embodiment of FIG. 7.

The invention has been disclosed in a general way and in connection with preferred embodiments. Those skilled in the art will be able to bring various variants and modifications. Especially, they will be able to use components other than zener diode and thyristors but having similar functions. On the other hand, an unidirectional protection device is described above. The invention similarly applies to bidirectional protection components; the changes and connections designed to form bidirectional protection devices from unidirectional protection devices being well known by those skilled in the art.

I claim:

1. A protection device against overvoltages liable to occur between two supply terminals (A, B) comprising, between said terminals, an avalanche triggered thyristor (6) having a determined break-over voltage ($V_{BO}$) further comprising a zener diode (4) in parallel and reversely connected with said thyristor, said diode being selected so that its avalanche voltage ($V_{BR}$) is lower than said break-over voltage and gets higher only for overvoltages having a duration of amplitude longer than a predetermined threshold.

2. A monolithic semiconductor component implementing the device according to claim 1, comprising an N-type semiconductor substrate (2) and comprising, in a first vertical portion, layers (21, 22, 23) adapted to form an avalanche triggered thyristor (6) and, in a second vertical portion, layers (25, 26) adapted to form a zener diode (4), the upper surface (28) of said semiconductor substrate being metallized and shorting the anode of said zener diode and the cathode of said thyristor, and the lower surface (29) of said semiconductor substrate being metallized and shorting the cathode of said zener diode and the anode of said thyristor, wherein an NP junction formed between said substrate (20) and a P type layer (21, 25) formed in said substrate adjacent said upper surface wherein is triggered the avalanche effect has a higher concentration gradient in said second portion than in said first portion.

3. A component according to claim 2, wherein in the upper surface of said substrate, is formed, in said first portion corresponding to said thyristor, a first P region (21) and, in the portion corresponding to said diode, a second P region (25), said second P region having a concentration gradient higher than the first one.

4. A component according to claim 2, wherein the upper surface of said substrate (20) comprises a P base region of said thyristor and a laterally adjacent P anode region of the diode, both formed adjacent said upper surface and, under the P base region (21, 25) of said thyristor and the anode region of the diode, respectively, a first N region (35) having a doping level higher than the substrate at said thyristor and a second N region (36) having a doping level higher than the first region at the diode.

5. An overvoltage protection device comprising:

a gateless avalanche triggered thyristor having a cathode and an anode and having a predetermined break-over voltage; and a zener diode connected in parallel with said thyristor, an anode of said zener diode connected to said cathode of said thyristor and a cathode of said zener diode connected to said anode of said thyristor, said zener diode having an avalanche voltage that is lower than said break-over voltage of said thyristor, said avalanche voltage increasing in response to overvoltages applied to said zener diode having a duration or an amplitude longer than a predetermined threshold.

6. The overvoltage protection device according to claim 5 further comprising:

a semiconductor substrate having upper and lower major surfaces with first and second electrodes respectively formed on said upper and lower major surfaces;

said zener diode including
 (i) a first anode region formed in said upper major surface in contact with said first electrode, and
 (ii) a first cathode region formed in said lower major surface in vertical alignment with said first anode region and in contact with said second electrode; and said gateless avalanche triggered thyristor including
 (i) a second cathode region formed in said upper major surface adjacent said first anode region and in contact with said first electrode, and
 (ii) a second anode region formed in said lower major surface adjacent said first cathode region and in vertical alignment with said second cathode region, said second anode region formed in contact with said second electrode.

7. The overvoltage protection device according to claim 6 wherein said semiconductor substrate includes
 (i) an upper layer of a first conductivity type formed in said upper surface of said substrate in contact with said first electrode, said upper layer forming said anode region of said zener diode, and
 (ii) a central layer of a second conductivity type formed intermediate said first and second major surfaces;

said first cathode region is of said second conductivity type; and said second anode region is of said first conductivity type.

8. The overvoltage protection device according to claim 7 wherein said first cathode region has a higher impurity concentration than an impurity concentration of said central region of said substrate.

9. The overvoltage protection device according to claim 7 wherein said second cathode region comprises a plurality of wells of said second conductivity type formed in said upper layer of said semiconductor substrate.

10. The overvoltage protection device according to claim 7 wherein said second cathode region comprises a well region formed in said upper layer of said semiconductor substrate and has a higher impurity concentration than an impurity concentration of said central region of said substrate.

11. The overvoltage protection device according to claim 7 wherein said semiconductor substrate further comprises a buried layer of said second conductivity type formed between said upper and central layers of said semiconductor substrate.

12. The overvoltage protection device according to claim 11 wherein said first and second cathode regions have higher impurity concentrations than an impurity concentration of said buried layer and said impurity concentration of said buried layer is higher than an impurity concentration of said central layer.

13. The monolithic semiconductor component, comprising:
   an N-type semiconductor substrate having a first P type region formed in an upper major surface thereof;
   a first vertical portion of said substrate including a first N-type region formed in said first P type region and a second P type region formed in a lower major surface of said substrate in said first vertical portion, said first vertical portion forming a gateless avalanche triggered thyristor;
   a second vertical portion of said substrate laterally adjacent said first vertical portion including a second N-type region formed in said lower major surface of said substrate in said second vertical region adjacent said second P type region, said second vertical portion forming a zener diode; and
   first and second metallization layers respectively formed on said upper and lower major surfaces of said substrate respectively connecting (i) an anode of said zener diode to a cathode of said thyristor, and (ii) a cathode of said zener diode to an anode of said thyristor,
   an NP junction formed between said substrate and said first P-type region having a higher concentration gradient in said second vertical portion than in said first vertical portion.

14. A component according to claim 13, wherein, said first P-type region formed in said first vertical portion has a lower concentration gradient than in said second vertical portion.

15. A component according to claim 13 further comprising a third N-type region formed in said substrate under said first P-type region, said third N-type region having an impurity concentration higher in said first vertical portion than in said second vertical portion.

* * * * *